United States Patent [19]

Holbrook et al.

[11] Patent Number: 4,615,032

[45] Date of Patent: Sep. 30, 1986

[54] SELF-ALIGNED RIB-WAVEGUIDE HIGH POWER LASER

[75] Inventors: Walter R. Holbrook, Exeter Township, Berks County; Claude L. Reynolds, Jr., Wyomissing; Julie A. Shimer, Bethlehem, all of Pa.; Henryk Temkin, Berkeley Heights, N.J.

[73] Assignee: AT&T Bell Laboratories, Murray Hill, N.J.

[21] Appl. No.: 630,691

[22] Filed: Jul. 13, 1984

[51] Int. Cl.[4] ............................................. H01L 3/19
[52] U.S. Cl. ...................................... 372/45; 357/17; 372/46
[58] Field of Search ................ 372/44, 45, 46; 357/17

[56] References Cited

U.S. PATENT DOCUMENTS 4,238,764 12/1980 Carballes et al. ...................... 357/71
4,352,187 9/1982 Amann .................................. 372/46

OTHER PUBLICATIONS

H. Kressel, "Large-Optical-Cavity (AlGa) As-GaAs Heterojunction Laser Diode: Threshold and Efficiency", J. Appl. Phys., vol. 43, No. 2, Feb. 1972, pp. 561–567.
Physics Letters, "A High-Power, Single-Mode . . . ", vol. 42, pp. 853–854, May 15, 1983, Wada et al.
Applied Physics Letters, "High-Power Constricted . . . ", vol. 36, Jan. 1980, pp. 4–6, Botez et al.
Applied Physics Letters, "Single-Mode Positive-Index . . . ", vol. 38, May 1, 1981, pp. 658–660, Botez et al.
IEEE Journal of Quantum Electronics, "Transverse Mode Stabilized $Al_xGa_{1-x}As$ . . . ", vol. QE-14, No. 2, Feb. 1978, Aiki et al., pp. 89–94.
Electronics Letters, "VLSI-Are Smaller . . . ", vol. 19, pp. 1–3, 1983.
Applied Physics Letters, "Terraced-Heterostructure Large . . . ", pp. 310–312, Aug. 15, 1982, vol. 41, Botez et al.
Applied Physics Letters, "High-Efficiency, Low-Threshold, . . . ", vol. 40, Feb. 1982, p. 208, Hong et al.
Applied Physics Letters, "High Optical Power CW . . . ", pp. 406–408, vol. 42, Mar. 1983, Yamamoto et al.
Applied Physics Letters, "Nonplanar Large Optical . . . ", pp. 734–736, vol. 35, Nov. 1979, Burnham et al.
Journal of Applied Physics, "Liquid Phase Epitaxial . . . ", vol. 53, pp. 9217–9219, Dec. 1982, Reynolds et al.
Electronic Letters, "New Stripe-Geometry Laser . . . ", vol. 15, p. 441, (1979), Amann.
Electronic Letters, "Single-Mode C.W. Ridge-Waveguide . . . ", p. 763, (1979), vol. 15, Dewinter et al.
IEEE Journal of Quantum Electronics, "Low-Threshold InGaAsP . . . ", vol. QE-19, No. 8, Aug. 1983, Kaminow et al., p. 1312.
IEEE Journal of Quantum Electronics, "Constricted Double-Heterojunction . . . ", vol. QE-17, #12, Dec. 1981, p. 2290, Botez.
IEEE Journal of Quantum Electronics, "Gain Measurements in . . . ", vol. QE-18, #1, Jan. 1982, p. 44, Dutta--Nelson.
Applied Physics Letters, "Longitudinal Mode Spectrum . . . ", vol. 43, Oct. 1983, No. 7, p. 619, Lau.
Applied Physics Letters, "CW High-Power Single-Mode . . . ", vol. 36, No. 3, Feb. 1980, p. 190, Botez.

Primary Examiner—James W. Davie
Attorney, Agent, or Firm—Wendy W. Koba; Peter V. D. Wilde

[57] ABSTRACT

The specification describes an improved form of heterostructure laser, termed a "Rib-Loc" laser. It is an easily fabricated device with desirable electrical and optical properties. The Rib-Loc is simple to fabricate because a single, self-aligned rib provides ohmic contact, current confinement and lateral waveguiding. A deeply etched P-cladding layer outside the rib provides the positive index change needed for an index-guided laser. The large optical cavity increases the maximum power output and reduces the aspect ratio of the beam.

15 Claims, 10 Drawing Figures

| LAYER | COMPOSITION | DOPING | THICKNESS |
|---|---|---|---|
| P-CAP | GaAs | Ge: $10^{18}$ cm$^{-3}$ | 0.3 μm |
| P-CLADDING | $Al_{.4}Ga_{.6}As$ | Mg: $4 \times 10^{17}$ cm$^{-3}$ | 1.3 μm |
| ACTIVE | $Al_{.07}Ga_{.93}As$ | NONE | .05-.10 μm |
| N-LOC | $Al_{.22}Ga_{.78}As$ | Te: $6 \times 10^{17}$ cm$^{-3}$ | .10-.15 μm |
| N-CLADDING | $Al_{.4}Ga_{.6}As$ | Te: $3 \times 10^{17}$ cm$^{-3}$ | 2.4 μm |
| n-SUBSTRATE | GaAs | Si: $10^{18}$ cm$^{-3}$ | 125 μm |

1 GHz

SELF-ALIGNED RIB-WAVEGUIDE HIGH POWER LASER

BACKGROUND OF THE INVENTION

There are currently a number of applications, including optical disk recording, printing, and fiber optic data distribution systems, which require lasers with high output power and stable fundamental mode behavior. Some of the device structures which have been demonstrated to meet these criteria are the twin ridge substrate, (see *Applied Physics Letters*, Vol. 42, p. 853 (1983)) constricted double heterostructure large optical cavity, (see *Applied Physics Letters*, Vol. 36, p. 4 (1980) and *Applied Physics Letters*, Vol. 38, p. 658 (1981)) channeled substrate planar, (see *IEEE Journal of Quantum Electronics*, Vol. QE-14, p. 89 (1978) and *Electronics Letters*, Vol. 19, p. 1 (1983)) terraced heterostructure large optical cavity, (see *Applied Physics Letters*, Vol. 41, p. 310 (1982)) deep Zn-diffused narrow stripe laser, (see *Applied Physics Letters*, Vol. 40, p. 208 (1982)) window V-channeled substrate inner stripe, (see *Applied Physics Letters*, Vol. 42, P. 406 (1983)) and the non-planar large optical cavity (see *Applied Physics Letters*, Vol. 35, p. 734 (1979)). These structures are characterized by median threshold currents in the range 20–80 mA for devices approximately 200 $\mu$m long, differential quantum efficiencies 20–60%, and continuous wave output powers 20–70 mW; however, the fabrication of these device structures typically involve several critical steps; e.g., precise control of Zn diffusion, selective etching of the substrate for epitaxial growth on a non-planar surface, and precise alignment of the contact stripe to the structure beneath the surface.

STATEMENT OF THE INVENTION

This invention is a new rib-waveguide large optical cavity structure for high power single mode operation, which requires only planar epitaxial growth and a single self-aligned etch step for current restriction and optical confinement. We refer to this device as the Rib-Loc structure and we present the fabrication, principles of operation, results of measurements to determine device properties, and a discussion of its potential in a number of applications. These data indicate that the electrical and optical properties of the a Rib-Loc laser match or exceed those of other AlGaAs high power lasers.

DETAILED DESCRIPTION

Figure 1:
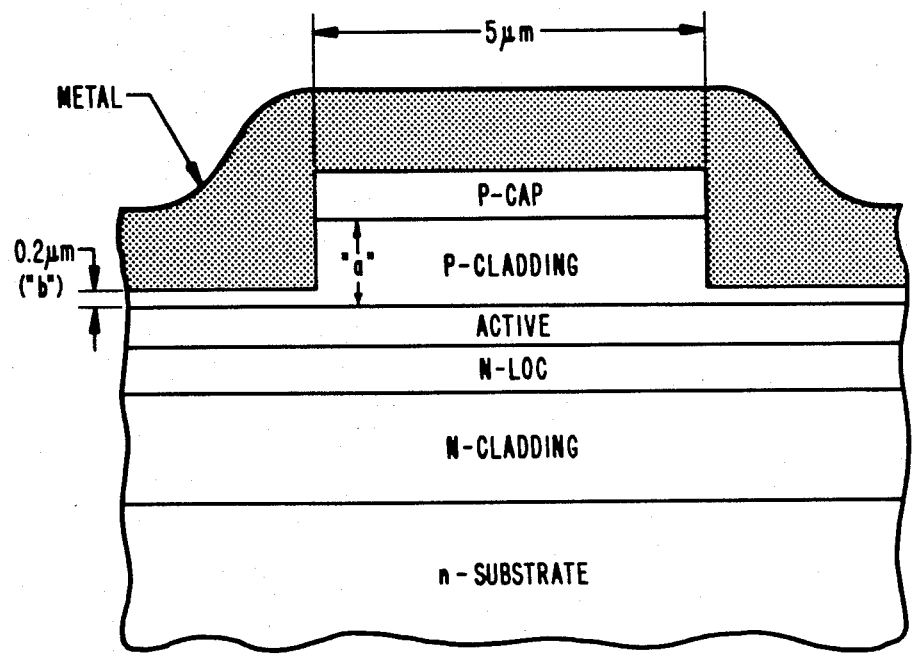
FIG. 1 is a Rib-Loc structure showing layer composition, doping, and device geometry.

The Rib-Loc structure, which is fabricated in a single epitaxial growth step, is shown in FIG. 1. This structure is an extension of the gain-guided Schottky barrier restricted (SBR) laser in which a single, self-aligned contact provides an ohmic stripe contact for current injection and a Schottky barrier outside the stripe for current restriction. By etching deep into the P-ternary layer in the Rib-Loc an index-guided structure is produced.

Although other epitaxial growth techniques could be used, lasers described here were grown on an n-GaAs substrate by liquid phase epitaxy (LPE) in a confined melt-sapphire boat (see *Journal of Applied Physics* Vol. 53, p. 9217 (1982)). The base structure consists of five layers:

N-Al$_{0.4}$Ga$_{0.6}$As: Te(2.4 $\mu$m),
n-Al$_{0.22}$Ga$_{0.78}$As: Te(0.1–0.15 $\mu$m) large optical cavity, undoped
Al$_{0.07}$Ga$_{0.93}$As(0.05–0.1 $\mu$m) active layer,
P-Al$_{0.4}$Ga$_{0.6}$As: Mg(1.3 $\mu$m), and p-GaAs: Ge(0.3 $\mu$m).

After growth the wafer is Zn diffused to form a p+ contacting layer, and the n-GaAs substrate is lapped to a thickness of approximately 100 $\mu$m and polished. For the N-metallization, Sn/Pd/Au is sputter deposited and alloyed. On the p-side, 6 $\mu$m wide stripes are defined by photolithography, and the p-layers are etched in H$_3$PO$_4$: H$_2$O$_2$:H$_2$O(1:1:8) within 0.2 $\mu$m of the active layer to form a 5 $\mu$m wide rib waveguide. Conventional metallization, e.g. Ti/Pt/Au, is then deposited and alloyed for the p-side followed by a Ti/Au deposition on both sides. Two mirror coating schemes were employed: a symmetric coating with a reflectivity of 33% per facet and an asymmetric mirror coat with one facet anti-reflective (AR) coated and one with 33% reflectivity. The laser chips are 250 $\mu$m wide and 380 $\mu$m long and are In-flux bonded p-side down onto a Cu heat sink.

The foregoing details of the structure and fabrication of the lasers used to demonstrate the efficacy of this invention are illustrative of a wide variety of choices known in the art. For example the active layer may be undoped or lightly doped p-type or n-type to form a p-n junction with one of the bounding layers. A variety of known dopants may be chosen. Structures complementary to that illustrated in FIG. 1 can be used. The thicknesses of the layers given in the table associated with FIG. 1 are exemplary. The active layer thickness can vary in a wider range of 0.03 to 0.2 $\mu$m and the thickness of the LOC layer can vary from 0.05 to 1.0 $\mu$m. No attempt is made here to exhaust the possible alternatives in the ways in which the invention can be implemented.

Current confinement in the Rib-Loc structure is similar to the SBR laser and is due to the qualitative difference between the metal contact to the highly doped GaAs p-cap (ohmic contact) and to the P-AlGaAs cladding layer (Schottky barrier). In the Rib-Loc laser current spreading outside the rib region is restricted because of the thin (<0.2 $\mu$m) cladding layer. The relative change in refractive index due to the abrupt change in p-cladding thickness provides lateral index guiding. Thus the Rib-Loc laser operates in a single transverse mode. Similar current confinement schemes have been reported in low power GaAs lasers (see *Electronics Letters*, Vol. 15, p. 441, (1979)). The ridge laser, itself, has also been fabricated in InGaAsP (see *Electronics Letters*, Vol. 15, p. 763, (1979) and *IEEE Journal of Quantum Electronics*, Vol. QE-19, p. 1312 (1983)). (See also U.S. Pat. No. 4,238,764 for a planar gain guided structure.) The large optical cavity increases the size of the lasing spot at the facet thereby increasing the maximum obtainable output power and reducing the output beam divergence. The results of lasers processed from five wafers are presented below.

Figure 2:
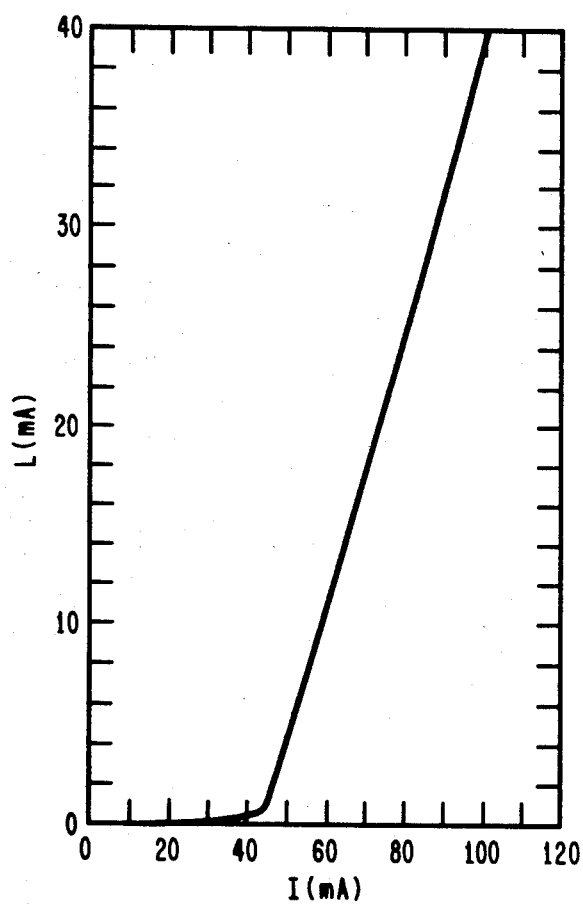
FIG. 2 is a plot of Light Power Output versus Current (L-I) for a Rib-Loc laser with asymmetric mirror coatings.

A continuous wave light output power versus current (L-I) characteristic for a Rib-Loc laser with asymmetric mirror coating is shown in FIG. 2. Rib-Loc lasers with asymmetric mirror coating have maximum output powers between 45–50 mW at the AR coated facet with a slope efficiency of 0.7 mW/mA, while lasers with symmetric mirror coatings operate in a single transverse mode up to 30–35 mW per facet with a slope efficiency of 0.35 mW/mA. The maximum output power is limited by catastrophic degradation. Rig waveguide structures without the Loc showed multiple transverse mode behavior and rollover below 10 mW.

Figure 3:
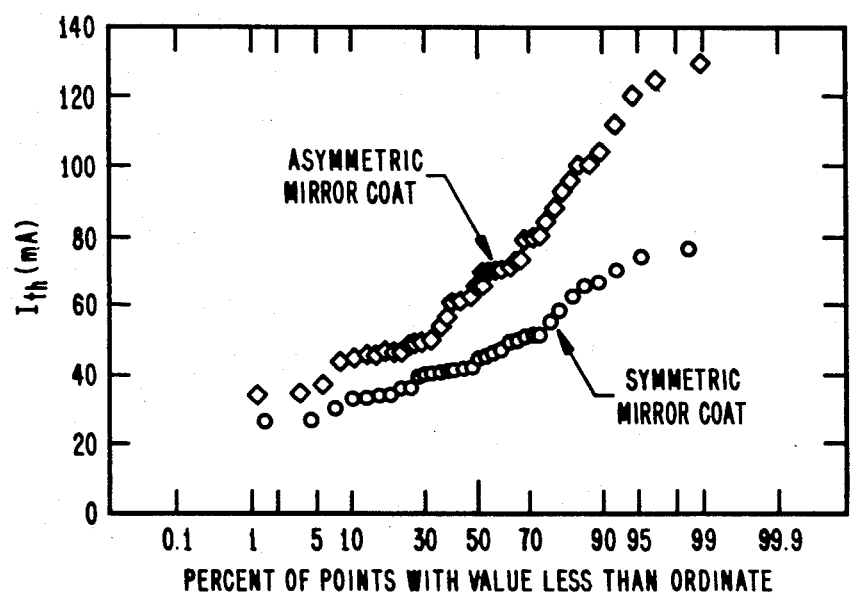
FIG. 3 is a plot of probability distribution of threshold currents for lasers from 3 wafers with symmetric mirror coatings and 2 wafers with asymmetric mirror coatings.

FIG. 3 shows a distribution of threshold current for Rib-Loc lasers with the two mirror coating schemes. The median threshold current is 40 mA for lasers with symmetric mirror coatings and 65 mA for lasers with asymmetric mirror coatings. The lasers in both distributions were selected on the basis of linearity to 10 mW and good electrical charateristics. The increase in median threshold for lasers with one AR facet coating is attributed to the reduction in facet reflectivity. The median threshold current for gain guided SBR lasers of the same chip size is 97 mA so the Rib-Loc structure results in a 40% to 60% reduction in threshold current density.

Figure 4:
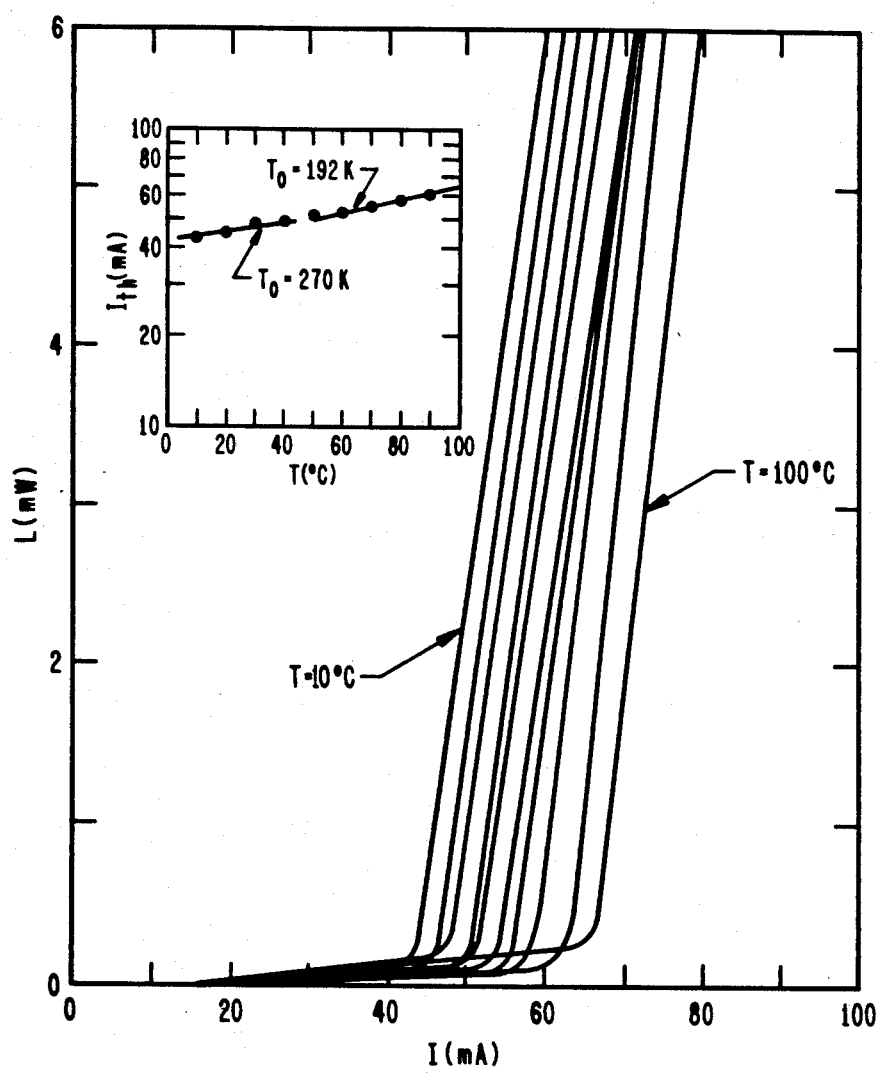
FIG. 4 is a determination of $T_o$ from pulsed L-I curves at T=10° C.–100° C.

The temperature sensitivity of threshold current for the Rib-Loc laser is characterized by a high value of $T_o$ even for temperatures above 60° C. Low duty factor (0.1%) pulsed L-I curves for a Rib-Loc laser are recorded in FIG. 4 for the temperature range from 10° C. to 100° C. The L-I curves are linear and the slope efficiency is constant to 100° C. A $T_o$ of 270K below 60° C. and $T_o = 192K$ for temperatures greater than 60° C. are determined from the log $I_{th}$ versus temperature plot shown in the inset of FIG. 4. These values for $T_o$ should be compared to typical values of $T_o = 160$–190K for gain-guided AlGaAs lasers between 0° and 60° C. The relative insensitivity of threshold current to temperature in the Rib-Loc structure results from the strong current confinement afforded by the rib-waveguide (see *IEEE Jounnal of Quantum Electronics*, Vol. QE-17, p. 2290, (1981) and *IEEE Journal of Quantum Electronics*, Vol. QE-18, p. 44 (1982)).

Figure 5:
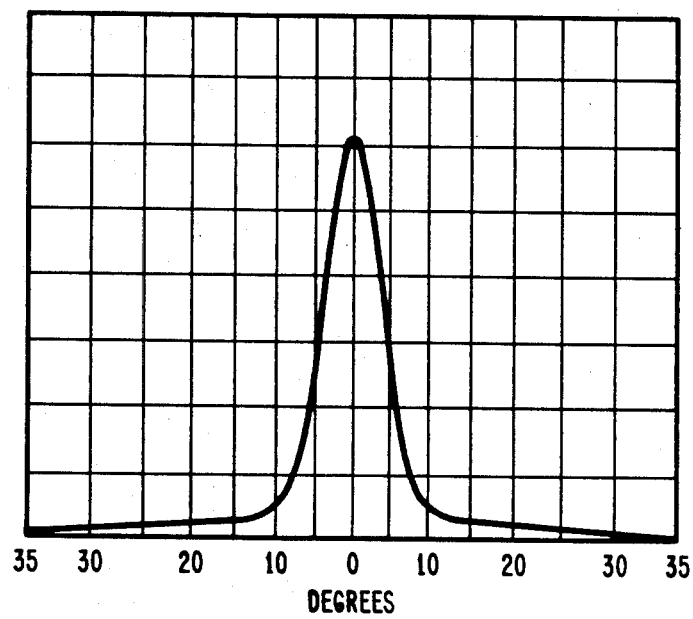
FIG. 5 is a far field pattern perpendicular to the junction for a Rib-Loc laser at 40 mW.
Figure 6:
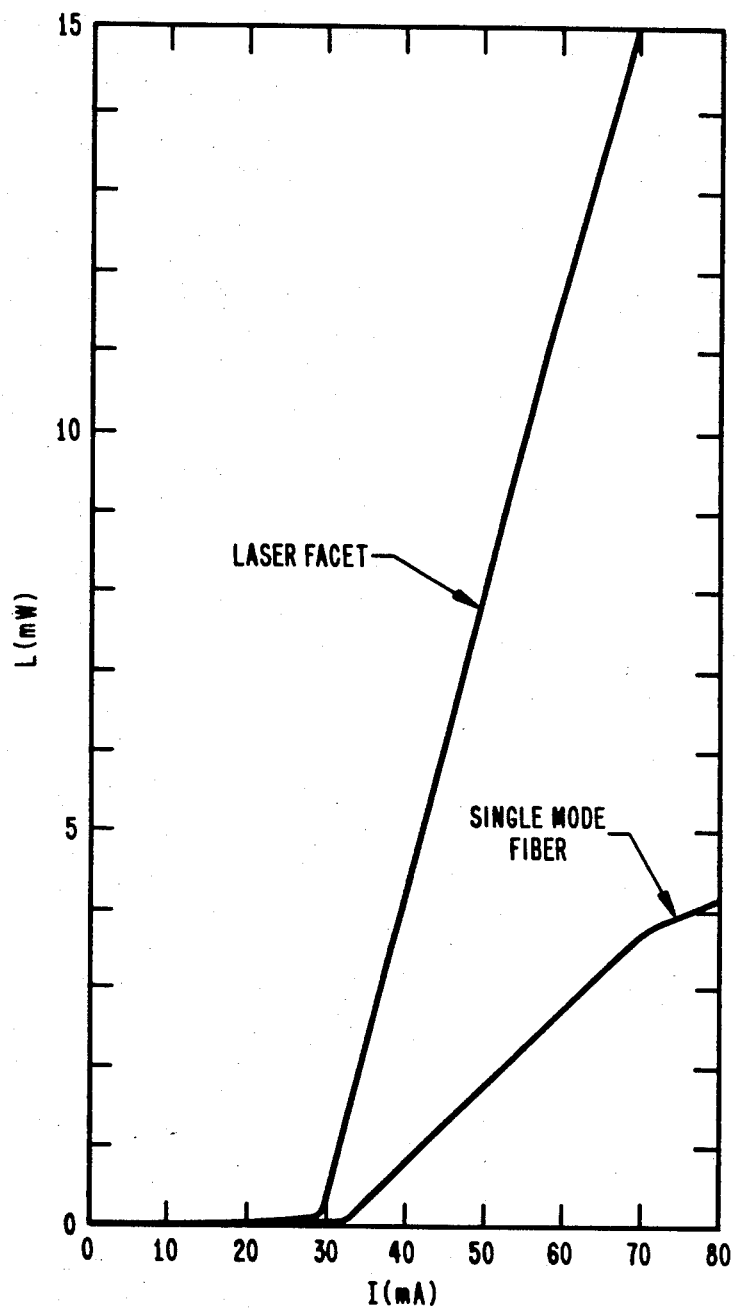
FIG. 6 is an L-I curve for light from the facet and from a single mode fiber butt coupled to a Rib-Loc laser, $\eta = 25\%$.

One of the most attractive properties of the Rib-Loc laser is its high optical beam quality. As observed in other index guided lasers, the Rib-Loc laser has zero astigmatism. The far field pattern parallel to the junction of a typical low threshold laser at 40 mW output (pulsed, 0.1% duty cycle operation) is shown in FIG. 5. The far-field is smooth and single lobed with a full width half maximum (FWHM) beam angle of approximately 9° and remains essentially constant from threshold to the catastrophic damage limit. The far-field pattern in the perpendicular direction is also smooth and single lobed, and the aspect ratio of the beam is typically 3:1. This output beam characteristic makes coupling the Rib-Loc laser to a single mode fiber possible. A 0.82 μm single mode polarization retaining fiber with a 5 μm core diameter was butt-coupled to the facet of a Rib-Loc laser. The resulting L-I curves with and without the fiber are plotted in FIG. 6 and indicate a coupling efficiency of 25%. This coupling efficiency could be improved by a factor of 2.5 with the use of lensed fibers. The light output from the Rib-Loc should be easily coupled into a typical 50 μm core multimode fiber or lens systems for optical imaging.

Figure 7A:
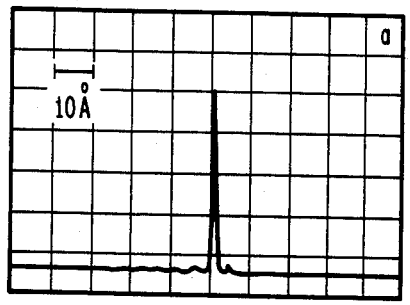
FIGS. 7(a)–7(c) are longitudinal mode spectra of a Rib-Loc laser 7(a) continuous wave, 7(b) 500 MHz, 7(c) 900 MHz.
Figure 7B:
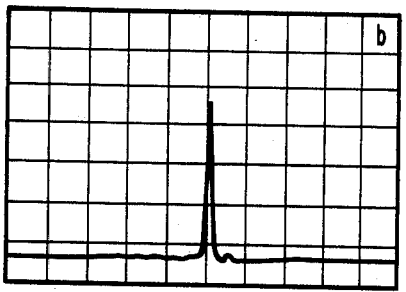
Figure 7C:
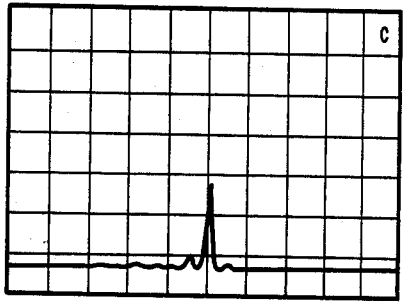

The dynamic properties of the Rib-Loc laser are also of interest. FIGS. 7(a)–7(c) show the influence of high frequency modulation on the longitudinal mode spectrum. The continuous wave spectrum at 54 mA D.C. for a laser with a threshold current of 45 mA is shown in FIG. 7(a). The single mode is at a wavelength of 8481A, and the intensity ratio to the weaker side modes is approximately 40:1. FIG. 7(b) shows the spectrum with an 18 mA peak-to-peak sinusoidal modulation at 500 MHz superimposed on the D.C. level. FIG. 7(c) shows the spectrum with the modulation frequency increased to 900 MHz. The intensity of the single mode in FIG. 7(b) is decreased by approximately 5% compared to the continuous wave spectrum. This decrease is probably due to the line broadening from the modulation so the time average intensity in the main mode may be the same as in FIG. 7(a). At 900 MHz the decrease in intensity is more pronounced, and an increase in the laser line width to approximately 2A is due to mode chirping. Other lasers show similar behavior in agreement with previously published results for index-guided AlGaAs lasers (see *Applied Physics Letters* Vol. 43, p. 619 (1983).

Figure 8:
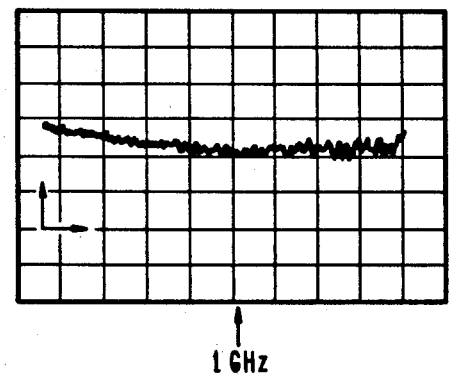
FIG. 8 is a modulation frequency spectrum of a Rib-Loc laser. (Vertical arrow indicates start of the test; horizontal arrow indicates the direction of scan.)

In FIG. 8 the same laser has been biased at threshold and a sinusoidal oscillation of 15 mA applied. The light output is sensed by a fast detector connected into a signal analyzer. The modulation frequency is scanned from 100 MHz to 2 GHz. The measurement begins at the vertical arrow and the horizontal arrow indicates the scan direction. The oscilloscope trace shows the frequency response curve. The vertical scale is 5 dB per division so the 3 dB loss point is approximately 2 GHz.

In order to evaluate the properties of the Rib-Loc laser it is useful to compare it to other high-power Al-GaAs lasers. Two of the most successful high-power lasers available today are the channeled substrate planar (CSP) and constrictured double-heterostructure large optical cavity (CDH-LOC). While both of these structures require only a single LPE growth step, they are grown on nonplanar substrates which provide the lateral optical confinement. This means that the substrates must be etched with careful attention to orientation, and the epitaxial layer thicknesses must be controlled very carefully as both these factors impact strongly on laser performance. Current confinement requires an additional alignment and etching step either through an oxide or a p-n junction. This alignment is also critical to laser performance and yield. The Rib-Loc laser, on the other hand, requires a planar epitaxial growth which can be grown by either vapor-phase or molecular beam, as well as liquid phase, techniques and a single etch step which requires no alignment. The absolute layer thicknesses are not critical for laser operation although thickness uniformity improves the etching yield.

The Rib-Loc threshold currents are typically 40–60 mA for devices which are 380 μm long compared to CDH-LOC thresholds of 75 mA for a 130 μm long device (see *Applied Physics Letters*, Vol. 36, p. 190 (1980)). The slope efficiency of the Rib-Loc laser with asymmetric mirror coat is 0.7 mW/mA compared to a 0.4 mW/mA for the L=130 μm CDH-LOC. The slope efficiency is expected to increase with decreasing cavity length. The L-I charateristic of the Rib-Loc laser shown in FIG. 2 is linear to 40 mW while the CDH-LOC shows roll-over above 20 mW continuous wave. We have operated Rib-Loc lasers continuous wave at heat sink temperatures of 100° C. compared to 70° C. maximum for the CDH-LOC and find a $T_o$ of 270K for the Rib-Loc while the CDH-LOC has $T_o=135K$ between 10° C. and 60° C. This was the highest $T_o$ previously reported for a structure with a large optical cavity. The far-field pattern parallel to the junction is single-lobed for the Rib-Loc while the CDH-LO shows side lobes at high powers which can limit coupling efficiencies to external optical components.

The Rib-Loc laser performance also compares favorably with the CSP laser. The Rib-Loc exhibits lower threshold currents and higher slope efficiencies than the CSP while maintaining a stabilized transverse mode and single longitudinal mode. The Rib-Loc also has a wider 3 dB bandwidth than the CSP for higher modulation currents.

The Rib-Loc laser's high quality optical beam makes it a candidate for optical disk recording applications and for coupling to single mode fiber systems. Its high power output makes it an attractive choice for an optical source for data distribution systems such as local area networks where losses from couplers, switches and filters dominate the system loss. The Rib-Loc laser's temperature insensitivity makes it useful in a wide range of environments.

Although the foregoing description is oriented in terms of gallium arsenide double heterostructure lasers, other heterostructure lasers can be made following these teachings. For example, long wavelength, high power Rib-Loc lasers can be made based on indium gallium aluminum phosphide. A wide variety of other III-V and II-VI heterostructures have also been proposed. The essence of the Rib-Loc structure is the combination of a large optical cavity, and a mesa-like structure (rib) for both optical confinement, due to the index of refraction difference between the rib and its surroundings (portion etched away), and current confinement due to the Schottky barrier (in the portion etched away). This new structural combination can be implemented in a variety of material combinations.

An important aspect of the invention is the dual thickness of the p-cladding layer shown in FIG. 1. Schemes may be devised to fabricate structures with such dual thickness layers on both sides of the active layer. Methods can be envisioned for forming the dual thickness layer by depositing a uniform first layer and forming the rib by lift-off or similar techniques. Thus the method used to form the rib is not critical to the invention.

The relationship between the thickness of the rib and the thickness of the cladding layer adjacent to the rib will affect the performance of the device. The device is designed so that an index of refraction difference is produced at the step in the cladding layer. The cladding layer adjacent the rib is made sufficiently thin (less than 0.5 μm) to allow this step index to influence the light guiding behavior of the active layer. It is recommended that the step be sufficient to create an effective index step $\Delta n$ of greater than $10^{-3}$ and preferably greater than $3 \times 10^{-3}$. The relative thicknesses (a to b in FIG. 1) may vary substantially, e.g. 100 to 1, to produce this result.

It may also be found advantageous in some applications to fabricate multiple ribs on a single substrate to produce laser arrays. The confinement scheme described here appears especially suited for designing such devices. Complex and very dense rib patterns can be produced reliably by known selective etching techniques.

Various additional modifications and extensions of this invention will become apparent to those skilled in the art. All such variations and deviations which basically rely on the teachings through which this invention has advanced the art are properly considered to be within the spirit and scope of this invention.

What is claimed is:

1. Device comprising
   a semiconductor cladding layer,
   a large optical cavity (LOC) layer on the cladding layer,
   an active layer on the LOC layer,
   a cladding layer on said active layer,
   said active layer forming with one of said cladding layers a p-n junction capable when biased electrically of generating light in the active layer and emitting said light into the LOC layer,
   at least one of said cladding layers having a rib portion, said rib portion being thicker than the remainder of the cladding layer,
   an ohmic contact layer covering the top of the rib, and
   a barrier layer covering the sidewalls of the rib and the remainder of the cladding layer and responsive to an external electrical signal source, said barrier layer, when biased by said external signal source, capable of creating a refractive index difference $\Delta n$ greater than $10^{-3}$ in the cladding layer at the edge of said rib.

2. Device comprising:
   an n-type semiconductor cladding layer,
   an n-type large optical cavity (LOC) semiconductor layer on said n-type cladding layer,
   a active semiconductor layer on said LOC layer forming therewith an active heterostructure p-n junction capable, when appropriately biased, of emitting light from the active layer into the LOC layer,
   a p-type cladding layer forming over the active layer, said p-type cladding layer having a current and optical confinement portion of a first thickness, and a rib portion having a second thickness, said current and optical confinement portion and said rib portion constituting portions of the cladding layer, the cladding layer being a single homogeneous semiconductor layer,
   a contact layer covering selectively said rib portion of the p-type cladding layer, in precise registration therewith, and forming therewith an ohmic contact,
   and a metal layer formed over said contact layer and the p-type cladding layer and forming, with said current and optical confinement portion, a Schottky barrier contact, and forming, with said contact layer, an ohmic contact.
   said first and second thicknesses of the aforesaid cladding layer being selected so that an effective refractive index difference, $\Delta n$, of greater than $10^{-3}$ is created at the edge of the rib portion.

3. Device of claim 2 in which Δn is greater than $3 \times 10^{-3}$.

4. Device of claim 2 in which said first thickness is less than 0.5 μm.

5. Device of claim 2 in which the LOC layer has a thickness of the range of 0.05 μm to 0.01 μm.

6. Device of claim 2 further including at least two reflecting surfaces on either side of said LOC layer forming an optical cavity resonator for sustaining coherent emission of radiation from said LOC layer.

7. Device of claim 6 in which the LOC layer comprises doped aluminum gallium arsenide.

8. Device of claim 7 in which the active layer and cladding layers comprise doped aluminum gallium arsenide.

9. Device of claim 8 in which the contact layer comprises gallum arsenide.

10. Device of claim 9 in which the metal layer comprises Ti/Pt.

11. Device of claim 8 in which the aluminum content of said active layer is less than that of the p-type cladding layer on one side and the LOC layer on the other.

12. Device of claim 11 in which the aluminum content of the LOC layer is less than that of the n-type cladding layer.

13. Device of claim 12 in which the aluminum content of the cladding layers is approximately the same.

14. Device of claim 12 in which the p-type cladding layer is doped with magnesium.

15. Device of claim 14 in which the n-type cladding layer and the LOC layer are doped with tellurium.

* * * * *

UNITED STATES PATENT AND TRADEMARK OFFICE
CERTIFICATE OF CORRECTION

PATENT NO. : 4,615,032

DATED : September 30, 1986

INVENTOR(S) : Walter R. Holbrook, Claude L. Reynolds, Jr., Julie A. Shimer, Henryk Temkin It is certified that error appears in the above-identified patent and that said Letters Patent is hereby corrected as shown below:

Column 7, line 7, "0.01" should read --0.1--.

Signed and Sealed this

Tenth Day of February, 1987

Attest:

DONALD J. QUIGG

Attesting Officer

Commissioner of Patents and Trademarks